United States Patent
Richardson et al.

(10) Patent No.: US 10,644,509 B2
(45) Date of Patent: May 5, 2020

(54) SK ANALYSIS TECHNIQUES

(71) Applicant: Avista Corporation, Spokane, WA (US)

(72) Inventors: Darrell Richardson, Spokane, WA (US); Erik Jon Lee, Otis Orchards, WA (US); Matt Michael, Spokane, WA (US); Greg Paulson, Spokane, WA (US); Will Stone, Spokane, WA (US)

(73) Assignee: Avista Corporation, Spokane, WA (US)

( * ) Notice: Subject to any disclaimer, the term of this patent is extended or adjusted under 35 U.S.C. 154(b) by 54 days.

(21) Appl. No.: 16/120,201

(22) Filed: Aug. 31, 2018

(65) Prior Publication Data

US 2020/0076194 A1    Mar. 5, 2020

(51) Int. Cl.
*H02J 3/18* (2006.01)
*G05B 13/04* (2006.01)
*H02J 3/00* (2006.01)

(52) U.S. Cl.
CPC .......... *H02J 3/1878* (2013.01); *G05B 13/041* (2013.01); *H02J 2003/007* (2013.01)

(58) Field of Classification Search
None
See application file for complete search history.

(56) References Cited

U.S. PATENT DOCUMENTS

| | | | | |
|---|---|---|---|---|
| 7,978,017 | B2* | 7/2011 | Pernia | H03B 5/04 |
| | | | | 331/1 R |
| 10,473,700 | B2* | 11/2019 | Kuroda | H02J 3/24 |
| 2011/0251732 | A1* | 10/2011 | Schweitzer, III | H02J 13/0013 |
| | | | | 700/297 |
| 2014/0070617 | A1* | 3/2014 | Detmers | H02J 3/32 |
| | | | | 307/64 |
| 2014/0244065 | A1* | 8/2014 | Biswas | H02J 3/00 |
| | | | | 700/298 |
| 2016/0336928 | A1* | 11/2016 | Kuznetsov | H02J 3/30 |
| 2018/0256242 | A1* | 9/2018 | Bluvshtein | H02M 7/53873 |
| 2019/0334352 | A1* | 10/2019 | Sugimoto | H02J 3/46 |

* cited by examiner

*Primary Examiner* — Ramesh B Patel
(74) *Attorney, Agent, or Firm* — Lee & Hayes, P.C.

(57) ABSTRACT

This disclosure describes techniques to evaluate power usage and characteristics on a power distribution system. The power distribution system may include local distribution systems as well as transmission systems. Additionally, this disclosure describes techniques to evaluate the power load on a power system, for example, by using two variable characteristics to model a power load as a sum of a constant impedance load and a constant power load.

25 Claims, 10 Drawing Sheets

SK ANALYSIS TECHNIQUES

BACKGROUND

Power Utilities are looking for ways to save energy. This is due in part to the increase in cost for constructing generation facilities. One of the many approaches to conserve energy in the power system is the practice of Conservation Voltage Reduction (CVR). CVR is implemented by lowering the voltage to the minimum allowable voltage at the customer farthest from the voltage control, for example, a voltage regulator. Lowering the voltage gives the Power Utility multiple advantages. For example, by providing a lower voltage there are fewer energy losses in the power lines. Less power is consumed by the customers in accordance with Ohm's Law. The cost of energy for the customer is also reduced.

SUMMARY

This disclosure describes techniques to evaluate power usage and characteristics on a power distribution system. The power distribution system may include local distribution systems as well as transmission systems. Additionally, this disclosure describes techniques to evaluate the effectiveness of Conservation Voltage Reduction (CVR), for example, by using two variable characteristics to model a power load as a sum of a constant impedance load and a constant power load.

BRIEF DESCRIPTION OF THE DRAWINGS

The Detailed Description is set forth with reference to the accompanying figures. In the figures, the left-most digit(s) of a reference number identifies the figure in which the reference number first appears. The same reference numbers in different figures indicate similar or identical items.

DETAILED DESCRIPTION

Overview

Figure 1:
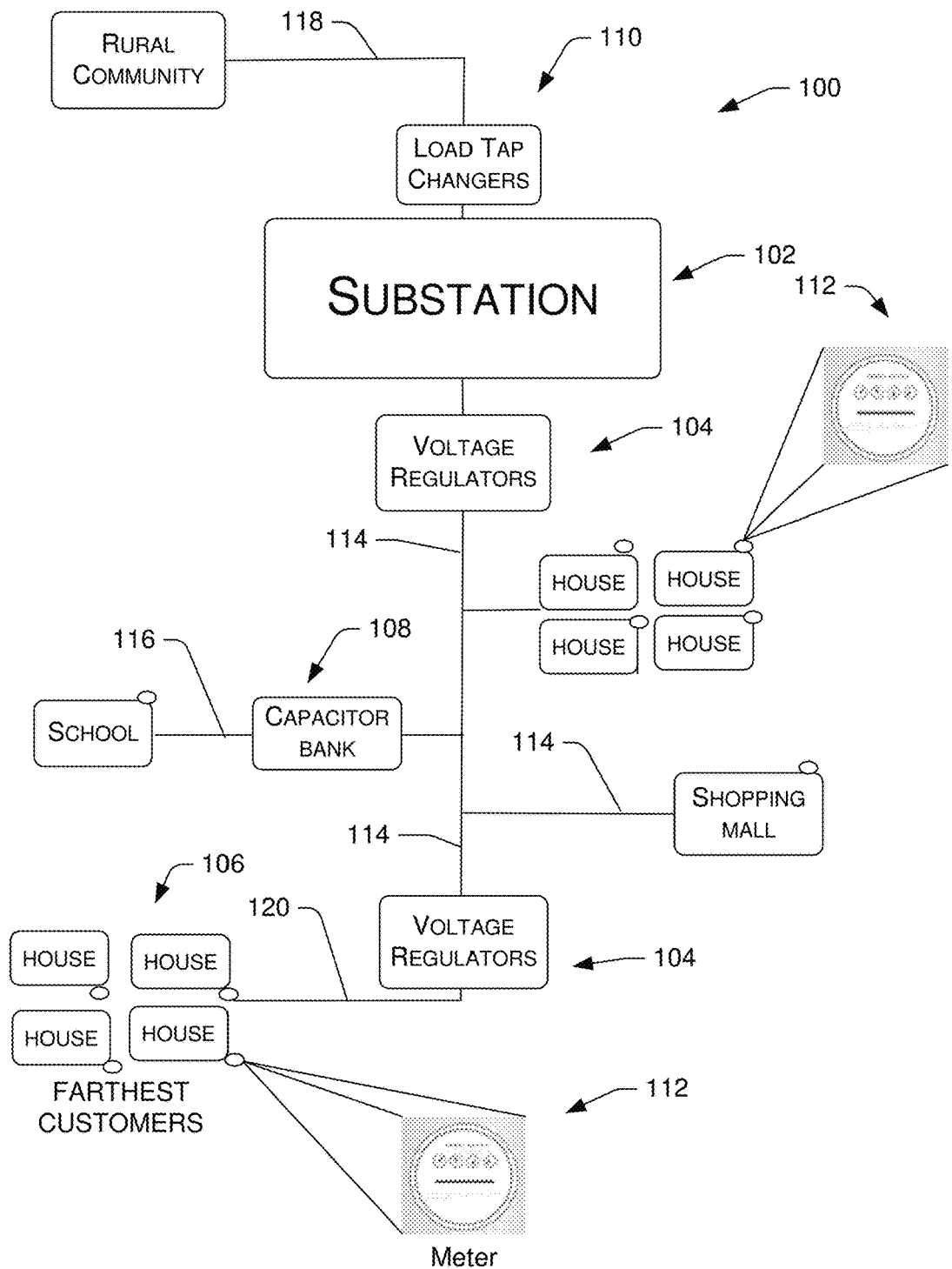
FIG. 1 shows an illustrative embodiment of an operating environment of a distribution system.

This disclosure describes techniques to evaluate power usage and characteristics on a power distribution system. The power distribution system may include local distribution systems as well as transmission systems. Additionally, this disclosure describes techniques to evaluate the effectiveness of Conservation Voltage Reduction (CVR), for example, by using two variable characteristics to model a power load as a sum of a Constant Impedance Load and a Constant Power Load.

CVR is a way to lower the power losses on distribution feeders by reducing the voltage level delivered to the loads. For example, CVR occurs by lowering the voltage level to a threshold. For example, the voltage level may be lowered near to the minimum allowable threshold voltage value, for example, of a distribution line. In the United States, for example, 114V is the lowest allowable threshold voltage level. This value of 114V comes from the minimum allowable value in 10% range on either side of the 120V at the customer level. (10% range of 120V is 114V to 126V). The minimal voltage level of 114V is held on the distribution level which is more efficient because the systems is able to meet the demand while providing less power overall. This lower level of voltage lowers the $I^2R$ losses. In short, less power is consumed by the loads at lower voltage levels. However, 114V is merely an illustrative example. It is appreciated that any voltage level on any type of line may benefit from CVR. Additionally or alternatively, CVR analysis may be conducted to evaluate options and tradeoff for providing higher voltage.

As an illustrative example, CVR may be used by lowering the voltage on the distribution feeder lines that run from substations to customers. Voltage regulators may be used at the substation and at other line locations, which may include, but is not limited to, neighborhoods, schools, shopping malls, and rural communities, to ensure that the voltage which is provided to the farthest customer at the end of the line is at least a threshold value, for example, 114V. Load Tap Changers (LTC) and Capacitor banks may also be used on feeders of a system to ensure the customers receive the required threshold value. For example, a measurement of a voltage value may be first collected at the farthest customer that is an electric power distribution point. This value is checked to see if it is near the required threshold value of 114V. If it is higher than 114V, the voltage at that point will be lowered and another value may be collected and compared until the threshold value of 114V is reached. Additionally or alternatively, other threshold values and ranges may be set to allow a CVR based saving while keeping the voltage above a minimum. For example, the CVR threshold may be set at 114.5V with a threshold range of 114.5V-114V being set below the CVR threshold of 114.5V. While, normally, Power Utilities keep the line voltage above the minimum threshold, it is understood, that if the value was determined to be below the threshold value or outside of the threshold range, the system would be able to increase the voltage subject to other safety considerations as it might indicate a problem in the system or at the customer. Voltage regulators may be used at all levels of distribution. For example, they may be positioned outside neighborhoods, customer's houses, on household appliances, machinery, battery banks, charging systems and energy storage units. Additionally, during CVR, various energy consumers require less reactive power. This may translate to a better power factor on the power system due to the smaller reactive load. As such, less effort may be required by the utility to correct the power factor with capacitor banks when the reactive load is reduced. By saving power across the entire distribution system a utility may have the ability to generate less power to keep up with demand.

An illustrative embodiment of a techniques models the load of an electric power system with a Constant Impedance Load (S) and a Constant Power Load (K). The illustrative SK Analysis technique models power consumed by a load as a function of voltage. SK Analysis provides an algorithm to relate power changes to voltage changes. Additionally or alternatively, illustrative SK Analysis techniques applied to systems with sufficiently accurate meters and synchronized measurements, is able to approximate real-time calculations. Additionally or alternatively, illustrative SK Analysis techniques, may be applied over a period of time. For example, an illustrative technique averages the SK parameters for two-time intervals on either side of a referenced time. Additionally or alternatively, additional SK parameters from other time intervals may be weighted or otherwise averaged.

Illustrative Operating Environment

FIG. 1 shows an illustrative embodiment of a distribution system 100. In this illustrative example, CVR is implemented by lowering a voltage value on the distribution feeder lines 114, 116, 118, and 120 that run from substations 102 to customers. Voltage regulators 104, Capacitor Banks 108, and Load Tap Changers 110 may be used at the substation 102 and at other line locations, which may include, but is not limited to, neighborhoods, schools and rural communities, to ensure that the voltage value which is provided to the farthest customer 106 at the end of the line is at least a threshold value, for example 114V at their meter 112. Voltage regulators 104 may be used at various levels of distribution, for example, positioned outside neighborhoods, customer's houses, on household appliances, machinery, battery banks, charging systems, and energy storage units among others.

Figure 2:
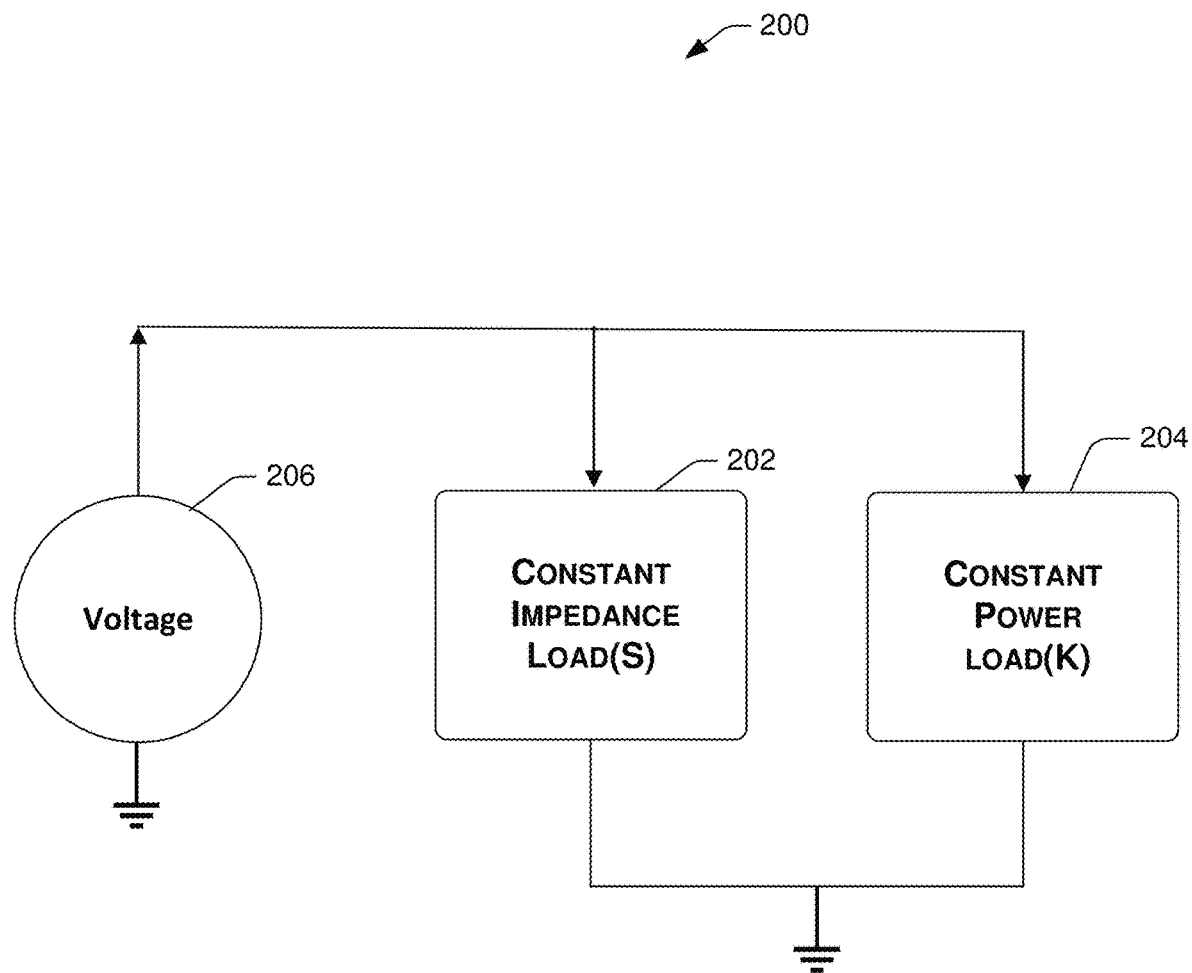
FIG. 2 shows an illustrative embodiment of the total load at a location represented by the sum of the Constant Impedance Load and the Constant Power Load.

FIG. 2 shows an illustrative embodiment of a total load 200 at a location represented by the sum of the Constant Impedance Load (S) 202 and the Constant Power Load (K) 204. The Constant Impedance Load term (S) 202, which is multiplied by the change in voltage squared; K for the Constant Power Load term 204 which remains constant despite changes in voltage. The resulting model can be represented as:

$$P_i = P_0[S(V_i/V_0)^2 + K] \quad (1)$$

where $P_0$ and $V_0$ are the reference power and reference voltage, and $P_i$, $V_i$ are the $i^{th}$ terms which represent the amount added or reduced from the reference power and reference voltage. $P_0$ and $P_i$ represent the real power supplied to the customer. Additionally or alternatively, this model may be applied to the related complex or apparent power. The addition of the Constant Impedance Load 202 and the Constant Power Load 204 models the entire power load resulting in equation 2

$$S + K = 1 \quad (2)$$

Re-writing (2), $$K = 1 - S \quad (3)$$

And substituting (3) into (1)

$$P_i = P_0[S(V_i/V_0)^2 + 1 - S] \quad (4)$$

Re-arranging terms $$P_i = P_0[S((V_i/V_0)^2 - 1) + 1] \quad (5)$$

This can be solved using various techniques, including for example, an iterative approach to find the minimum of $$0 = P_0[S((V_i/V_0)^2 - 1) + 1] - P_i \quad (6)$$

Or directly as $$S = \frac{\frac{P_i}{P_0} - 1}{\left(\frac{V_i}{V_0}\right)^2 - 1} \quad (7)$$

Further, equation 3 allows Conservation Voltage Reduction (CVR) to be performed by only having to relate power to resistance changes as a function of voltage through one variable, in this case for example, the Constant Impedance Load (S). However, it is appreciated that other variables, for example, K may be used instead of S.

Additionally, feeder level and customer level data has been reviewed in the process of developing SK Analysis resulting in some practical observations related to the operational environments.

For example, to implement an illustrative embodiment of SK Analysis on a feeder, the reference time is typically taken at the time an SK parameter is desired. Due to poor signal to noise ratios it is often desirable to set a minimum step size for $V_i/V_0$ and to pick multiple time intervals to allow application of a smoothing process, such as, for example, averaging, including, but not limited to, a rolling average, a weighted average, or combinations thereof, among other techniques. Using multiple time intervals having a minimum voltage step change in turn uses a maximum window to look within. Implicit with those intervals and windows is that during the window, the SK parameters are considered to be constant. However, this doesn't hold during periods of significant load changes. However, with illustrative embodiments of SK Analysis the error associated with a significant load change is only applied to the relevant time periods of the load change. For example, various embodiments contemplate any error or change only impacts the time instant the SK values are being evaluated. For example, the continuous nature of SK analysis results in little to no need for extrapolation.

Additionally or alternatively, there are two types of feeder/meter voltage and power transients that use differentiation in SK Analysis. For example, a primary type of transient presents as source transients. These are likely due to source or load variations on the source side of the measurement device. They often fit the expectation that power varies with voltage based on SK parameter. The second type is a load transient located on the load side of the measurement device. In this case power and voltage move in opposite directions resulting in negative SK parameters. Conceptually the first case can be viewed as an ideal voltage source with a voltage change driving a load. The second case can be viewed as a non-ideal voltage source responding to a change in load. The second case creates negative values for the Constant Impedance Load (S). Negative S values can be used to eliminate some time intervals from consideration when performing an averaging type function within a window of time to calculate the best SK.

Illustrative Techniques

Figure 3:
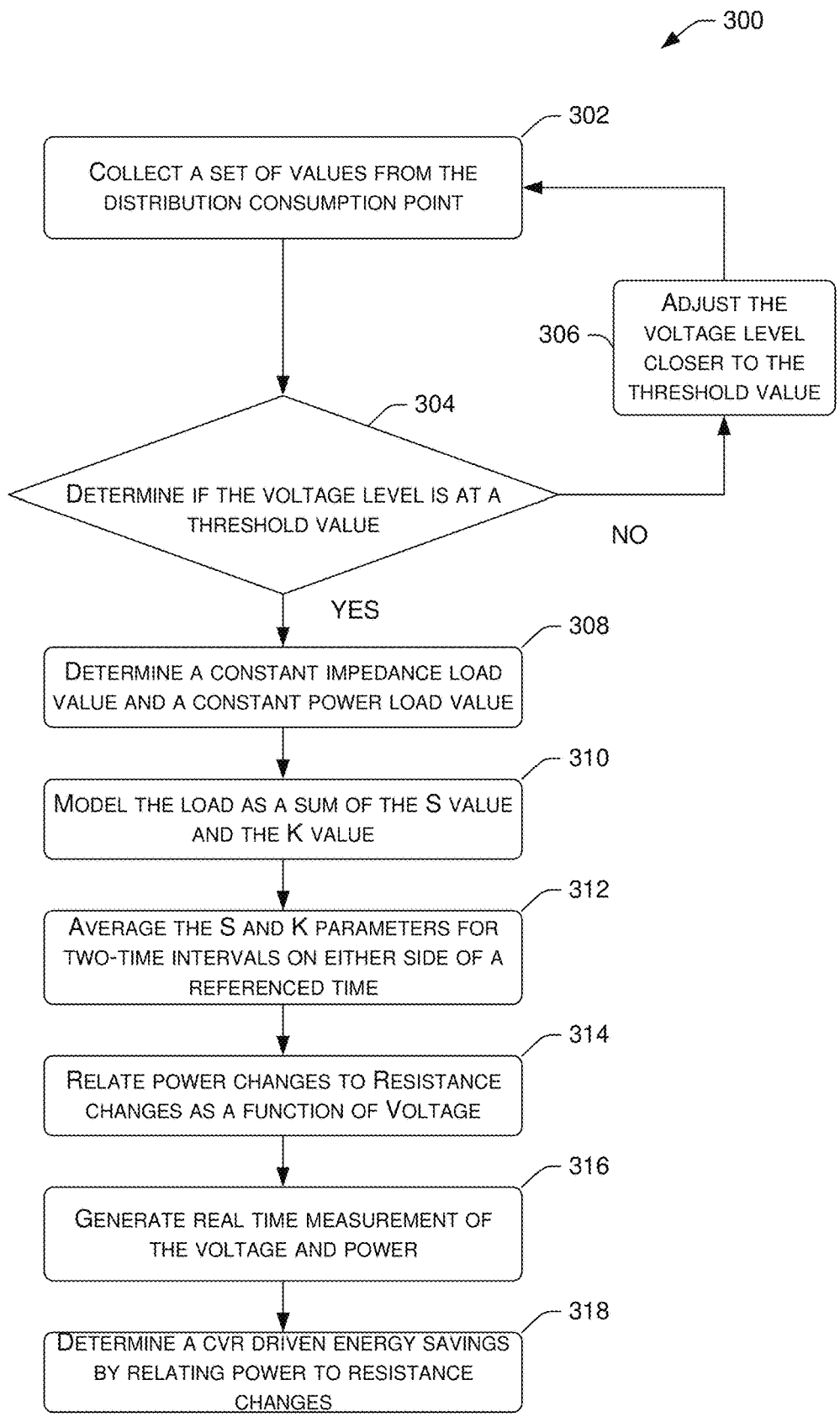
FIGS. 3 and 4 show an illustrative embodiments of processes that determines if the voltage value at the furthest customer is at least the threshold value.

FIG. 3 shows an illustrative SK Analysis technique 300. For example, at 302, a value or set of values may be collected at a farthest customer, for example, 106 that is an electric power distribution point. At 304, the value may be checked to determine if it is near the required threshold value, for example, 114V. If it is at a value other than the threshold value, for example, 114V, the voltage at that value will be adjusted at 306 and another set of values may be collected at 302. At 304, if the threshold value is reached a Constant Impedance Load value (S) and a Constant Power Load value (K) are determined at 308. Illustrative embodiments contemplate that the sum of S and K are used to model the load at 310. A reference time is selected and S and K parameters are averaged for the two-time intervals on either side of the selected referenced time at 312. The power changes are then related to the resistance changes as a function of voltage at 314. This information may allow for a real-time measurement of voltage and power at 316 since power changes have been related to voltage changes. A CVR driven energy savings may be determined by relating power to resistance changes at 318.

Figure 4:
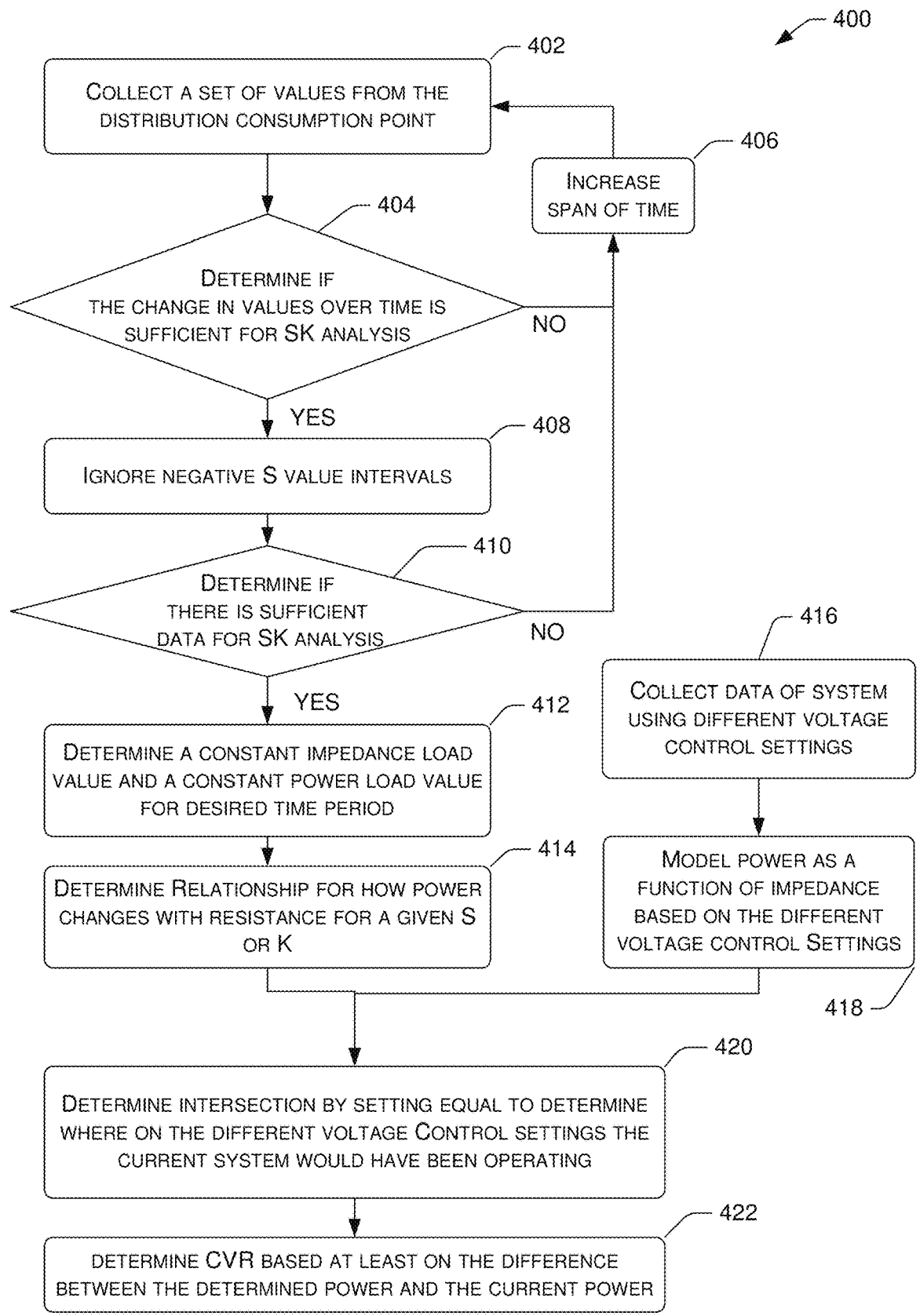

FIG. 4 shows another illustrative SK Analysis technique 400. For example, at 402 the system may collect a set of values from the distribution consumption point at the current voltage control settings. For example, CVR control settings may be enabled causing the voltage to be reduced to a lower threshold.

At 404, the system may determine, based at least in part on the collected data, whether there is enough changes in the collected data over a time period sufficient to perform an SK analysis. For example, a threshold amount of changes reflected in the data may drive an accuracy of the SK analysis sufficient to meet an accuracy threshold. If the system determines that the data is not sufficient, then at 406, the system may increase the span of time to evaluate. Various embodiment contemplate that the system may increase the amount of time equally on both sides of the time period or bias it to before or after the time period. Various embodiments contemplate that after the time span is increased, the system may revert back to 402 if more data is to be collected, or may go directly to 404 to evaluate the data over the new time period. If the system determines the data is sufficient, then at 408, the system may apply a filter to the data. For example, the system may ignore or remove any negative S value intervals.

At 410, the system may determine whether there is sufficient data for the analysis after the one or more filters have been applied. If no, then the system may go to 406 to increase the time span.

If yes, then at 412, the system may determine a constant impedance load value and a constant power load value for the desired time period. For example, the system may determine SK values over the time period.

At 414, the system determines the relationship for how power changes with resistance for a given S or K. For example, the system may generate equations describing the relationship.

At 416, the system may collect, receive, or access data of the electrical system operating at a different voltage control setting. For example, the data may reflect the system's earlier operation where CVR was not enabled.

At 418, the system models power as a function of impedance based on the system's operation at the different voltage control settings.

At 420, the system may determine where the current system would have been operating on model. For example, the system may set the relationships from 414 and the model from 418 equal and solve for the intersection. This allows the system to determine how the current system with the current voltage controls would have been operating at the different control settings. It is worth noting that the system may not have ever operated as the model predicts the current system would have operated with the different voltage control settings, and would not have collected that specific data point at 416.

At 422, the system may determine the difference of operating at the different voltage control settings. For example, if the current voltage control settings reflected CVR being enabled, and the different voltage control settings represented CVR being disabled, then the difference between how the current system would have been running from 420 and the current power from 402 is the amount of power saved through the use of CVR.

Various embodiments contemplate that the information may be gathered from a residence through a smart meter 112 or other suitable devices, for example, including, but not limited to, at breakers, transformers, regulators on feeders or transmission lines, among others or combinations thereof. Additionally, or alternatively, the information collected from the user may be analyzed near the user or residence, or it may be transmitted across a connection to an offsite location for analysis. Additionally, or alternatively, the information may be passed through various networks, including, but not limited to a customer gateway, local area network, wired network, wireless network, among others or combinations thereof. Additionally, or alternatively, predictive analytics may be performed on the collected data. For example, the data may be transmitted to an offsite server or to the utility to analyze the data and/or requests from the user as well as provide a response to the request. The analysis may be based at least in part on proprietary databases as well as third party databases.

Figure 5:
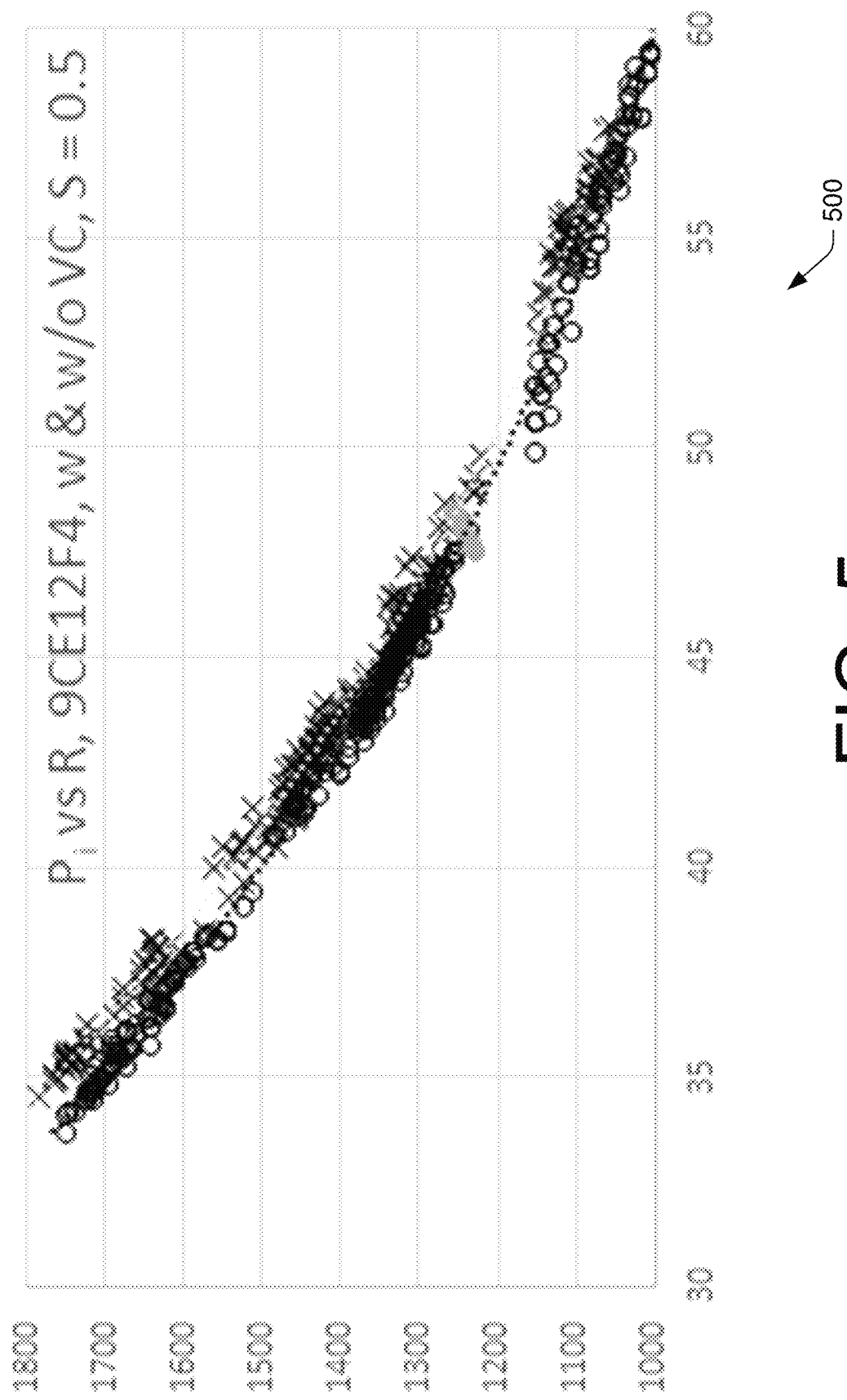
FIGS. 5 and 6 show an illustrative embodiment of data collected with Voltage Control and data collected without Voltage Control.

FIG. 5 shows an illustrative embodiment 500 of two sets of data were taken at a point in an illustrative feeder at a substation of a power utility. The points on FIG. 5 contain two sets of data represented by "X's" and "O's". The "X's" represent of data collected without Voltage Control (VC). The "O's" represent data collected with VC. Where VC indicates that CVR measures are active. FIG. 5 shows data that characterizes how real power (P), measured in kW, changes with resistance (R) for the period prior to dropping the voltage.

Figure 6:
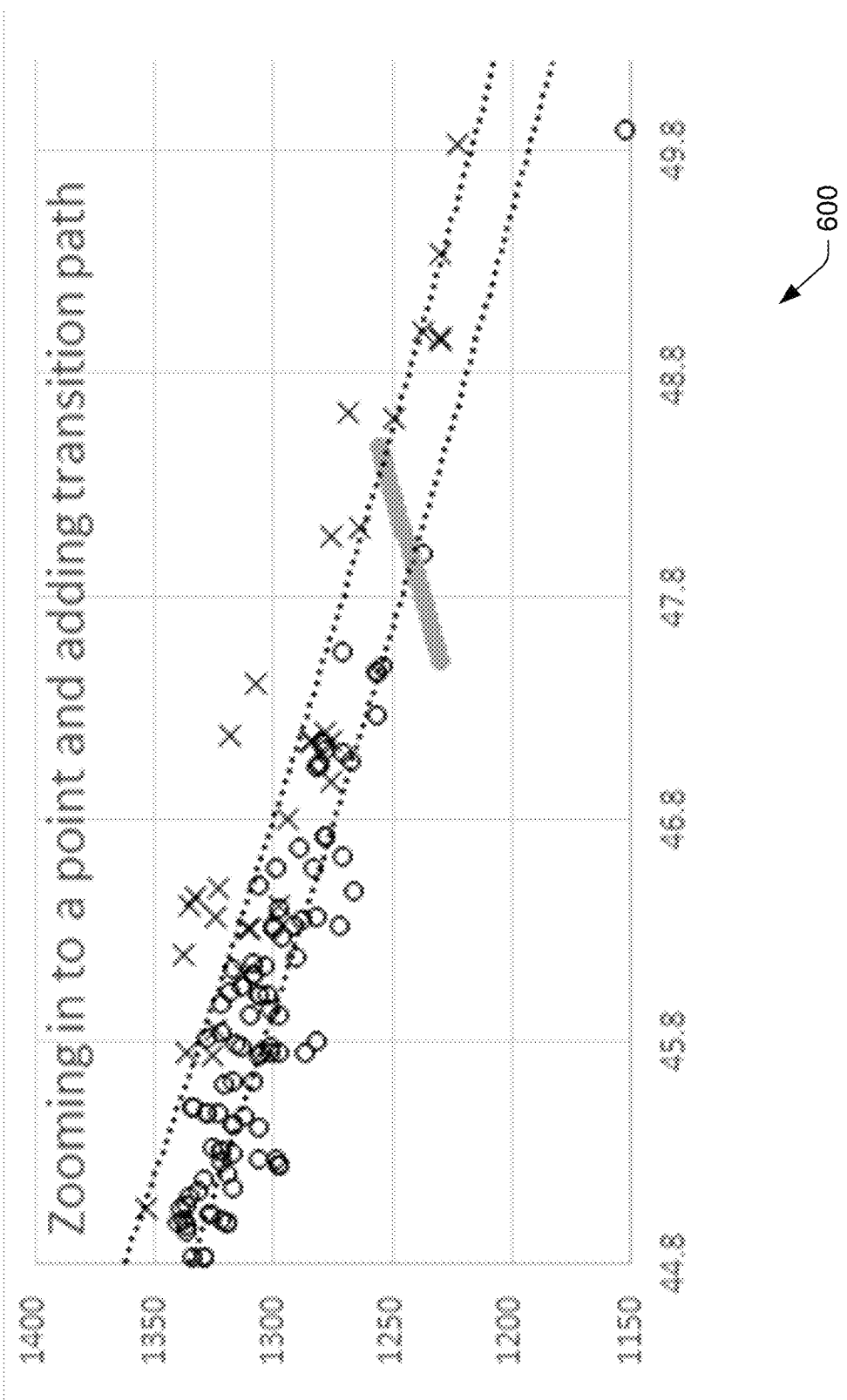

FIG. 6 shows an enlarged view point 600 of FIG. 5. For example, in FIG. 6, the VC values have a lower power value than the values without VC. A linear least squares fit would be ideal for a theoretical model to the data. However, this is not ideal in this case due to the parabolic trajectory of the power vs resistance relationship.

Various embodiments contemplate leveraging a relationship between voltage and resistance with the Constant Impedance Load. For example, voltage (V) and resistance (R) are related by the Constant Impedance Load (S) based on Ohm's law. Ohm's law can be combined with the electrical power to get:

$$P = V^2/R \tag{8}$$

Ohm's Law for the Reference Power, Voltage, and Resistance:

$$P_0 = V_0^2/R_0 \tag{9}$$

Dividing equation 8 by equation 9.

$$P/P_0 = (V^2/R)/(V_0^2/R_0) \tag{10}$$

Let $P/P_0 = \Delta P$, $V/V_0 = \Delta V$, $R/R_0 = \Delta R$
Using Ohm's law and the terms above $$\text{Then } \Delta P = (\Delta V)^2/\Delta R \tag{11}$$

Using the rearranged equation 2

$$K = 1 - S \tag{2}$$

Inserted into equation 1 and leading to equation 5

$$P = P_0(S[(V/V_0)^2 - 1] + 1) \tag{12}$$

Dividing by $P_0$:

$$\Delta P = S[(\Delta V)^2 - 1] + 1 \tag{13}$$

Set the two equations 11 and 13 equal to each other:

$$(\Delta V)^2/\Delta R = S[(\Delta V)^2 - 1] + 1 \tag{14}$$

Solving for $\Delta R$:

$$\Delta R = (\Delta V)^2/(S[(\Delta V)^2 - 1] + 1) \tag{15}$$

Equation 15 may be leveraged by illustrative techniques to determine the change in resistance based on the change in voltage for a given Constant Impedance Load value.

Figure 7:
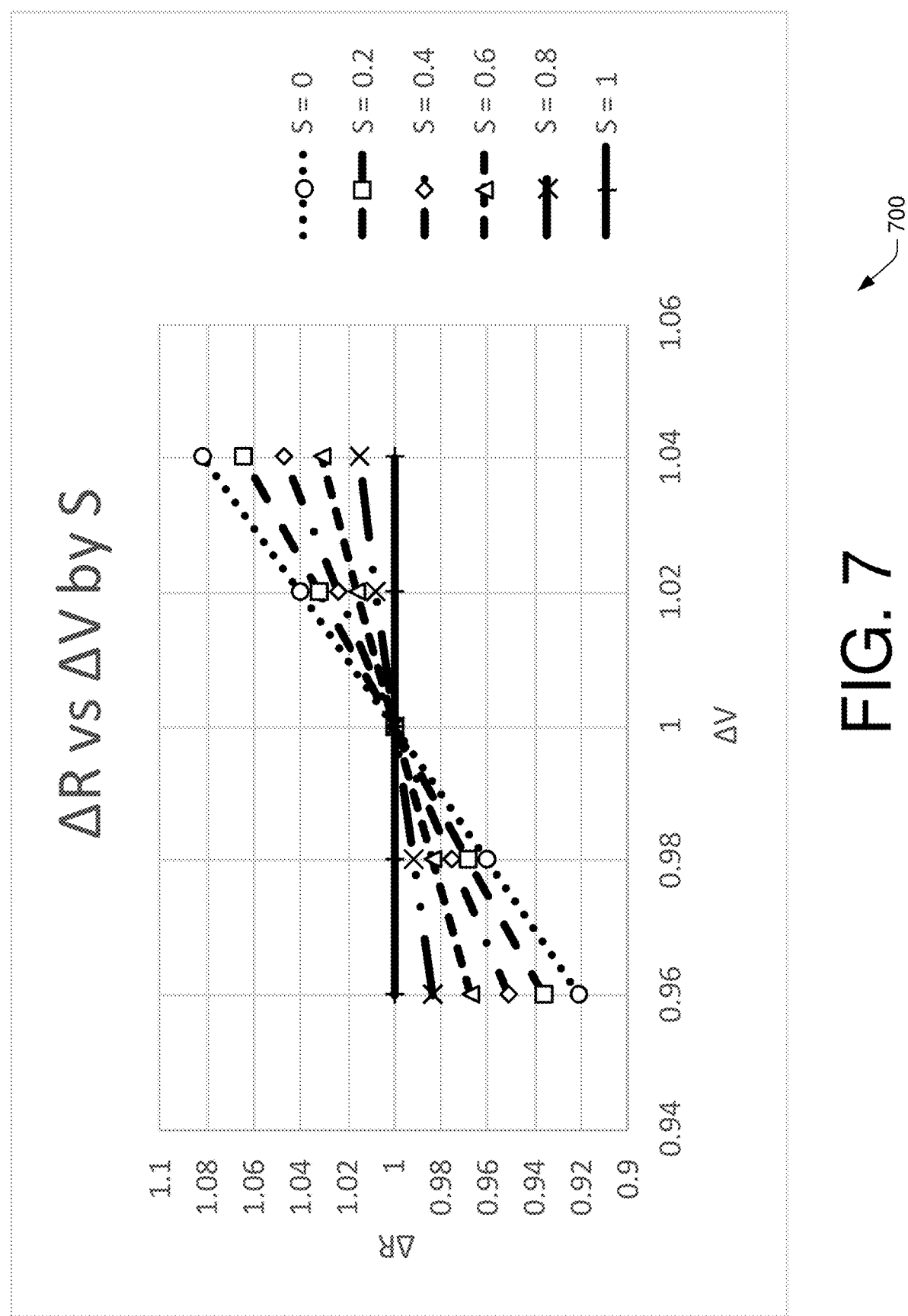
FIGS. 7, 8, and 9 show an illustrative embodiment of data arranged to determine how Resistance changes with Voltage for a given Constant Impedance Load value.

FIG. 7 shows an illustrative embodiment of data 700 from equation 15 arranged by varying the Constant Impedance Load (S) variable from 0 to 1. and changing the ΔV values from 0.96 to 1.04 to determine the resulting ΔR values. For example, when S=0, ΔR is related to ΔV as represented by the sloped line in FIG. 7. When S=1, ΔR isn't affected by changes in ΔV, and therefore, ΔR=1 as represented by the horizontal line in FIG. 7.

Figure 8:
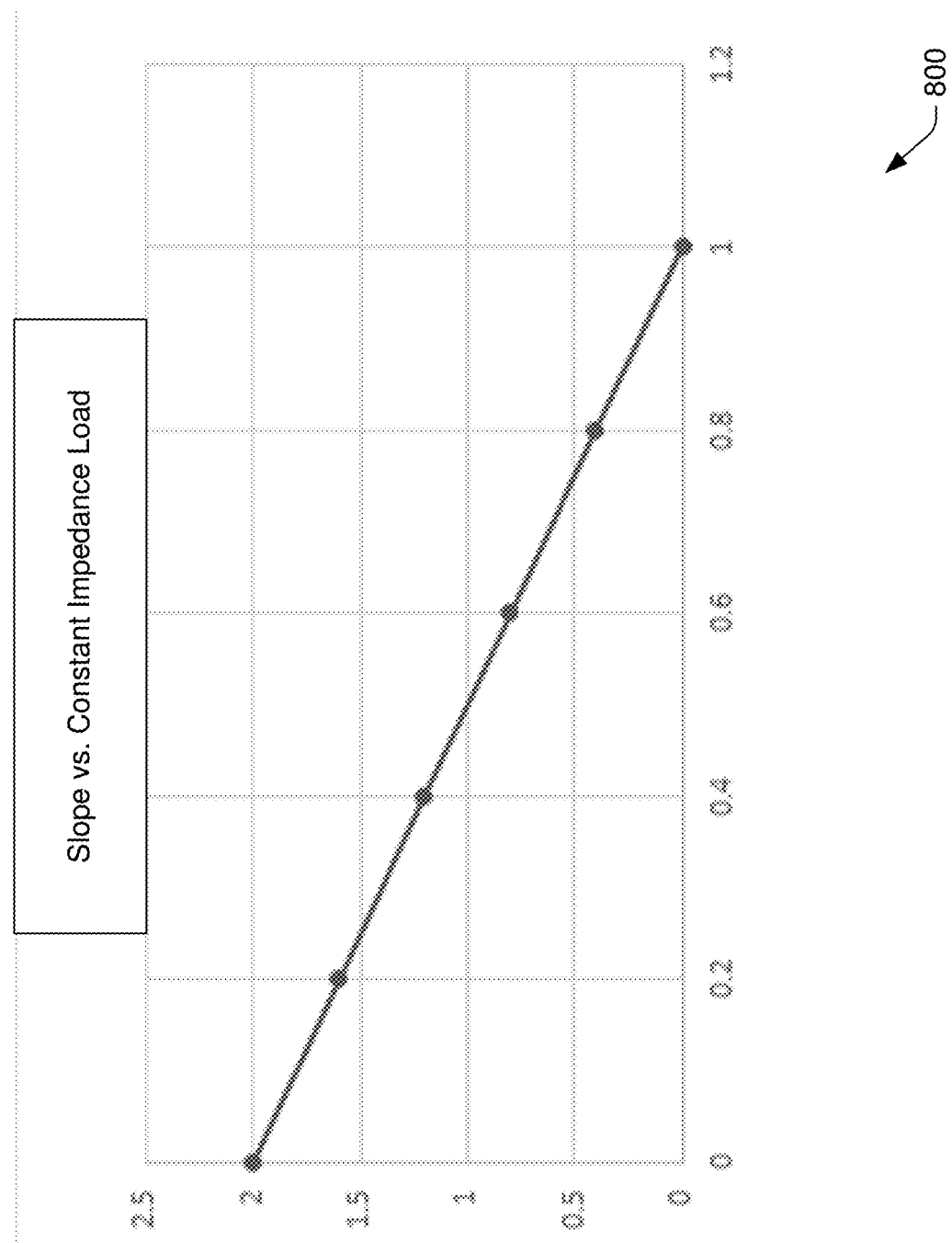

FIG. 8 shows an illustrative embodiment 800 using the equation for a line (Y=aX+b) and taking the slope of the lines from the equations in FIG. 7 and plotting them vs the Constant Impedance Load term (S).

Figure 9:
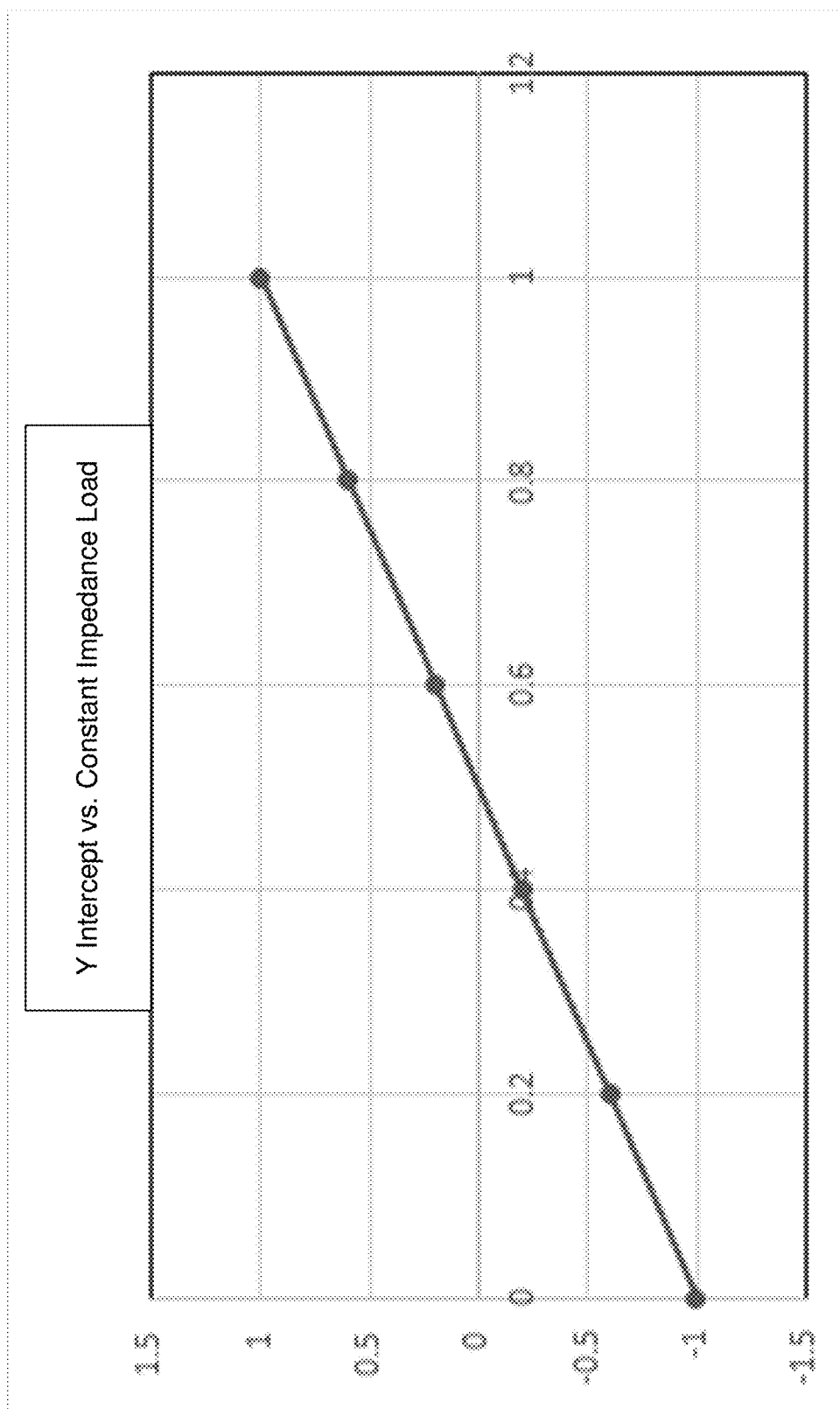

FIG. 9 shows an illustrative embodiment 900 using the Y-intercept of the lines from the equations in FIG. 7 and plotting them vs the Constant Impedance Load term(S).

Using the above relations, illustrative techniques may determine how the resistance (R) changes with voltage (V) for a given Constant Impedance Load (S). The relation between R and V for a given S was of the form ΔR=aΔV+b where a and b were functions of S.

Additionally or alternatively, various embodiments contemplate determining SK factors for multiple devices, locations, loads, feeders, lines, or combinations thereof among others. For example, a first constant impedance load value and a first constant power load value may be determined based at least in part on voltage values and power values from collected data of a first power consumption point while a second constant impedance load value and a second constant power load value may be determined based on voltage values and power values from collected data of a second power consumption point. From this information, a system may make various changes to the system or to the loads for various reasons with various results.

For example, based at least in part on the first constant impedance load value, the first constant power load value, the second constant impedance load value, and the second constant power load value, a load at one or more of the first power consumption point or the second power consumption point may be adjusted. For example, the load may be adjusted to adjust a voltage drop along a line, for example, between the first and second power consumption points. For example, the loads may be adjusted to level a voltage drop between the first power consumption point and the second power consumption point. For example, by leveling the loads and voltage drops, the required voltage that must be supplied across the line may be reduced. This may allow CVR to be achieved or improved. Additionally or alternatively, the loads may be adjusted to reduce an overall load on system that provides power to the power consumption point and the second power consumption point. This may allow the system to keep from overloading the line. Additionally or alternatively, this may allow an increased overall delivery of energy across the line without overloading the line.

Additionally or alternatively to adjusting a load at a power consumption point, the system may use similar information to adjust a power source at a point along the line, for example, a power consumption point, or a power supply point. Current distributed systems contemplate that many locations may be either a power consumer or a power supplier at any given time. For example, a distributed power network may have various locations that have energy producing or storing devices. For example, a location may have various types of energy storage devices (e.g., batteries, momentum wheels, capacitors, chemical storage, thermal storage, among others), a fuel cell, a solar panel, a windmill, a hydropower generator, a geothermal energy system, a biomass energy system, or combinations thereof among others.

The system, for example, may adjust a power source at a consumption point to provide power to the system to reduce an overall load on the system or to reach a desired voltage level on the system. For example, the SK analysis may enable the distributed system to more effectively reduce an overall load on a system or more effectively realize CVR on a system.

Illustrative Computing Device and Illustrative Operational Environment

Figure 10:
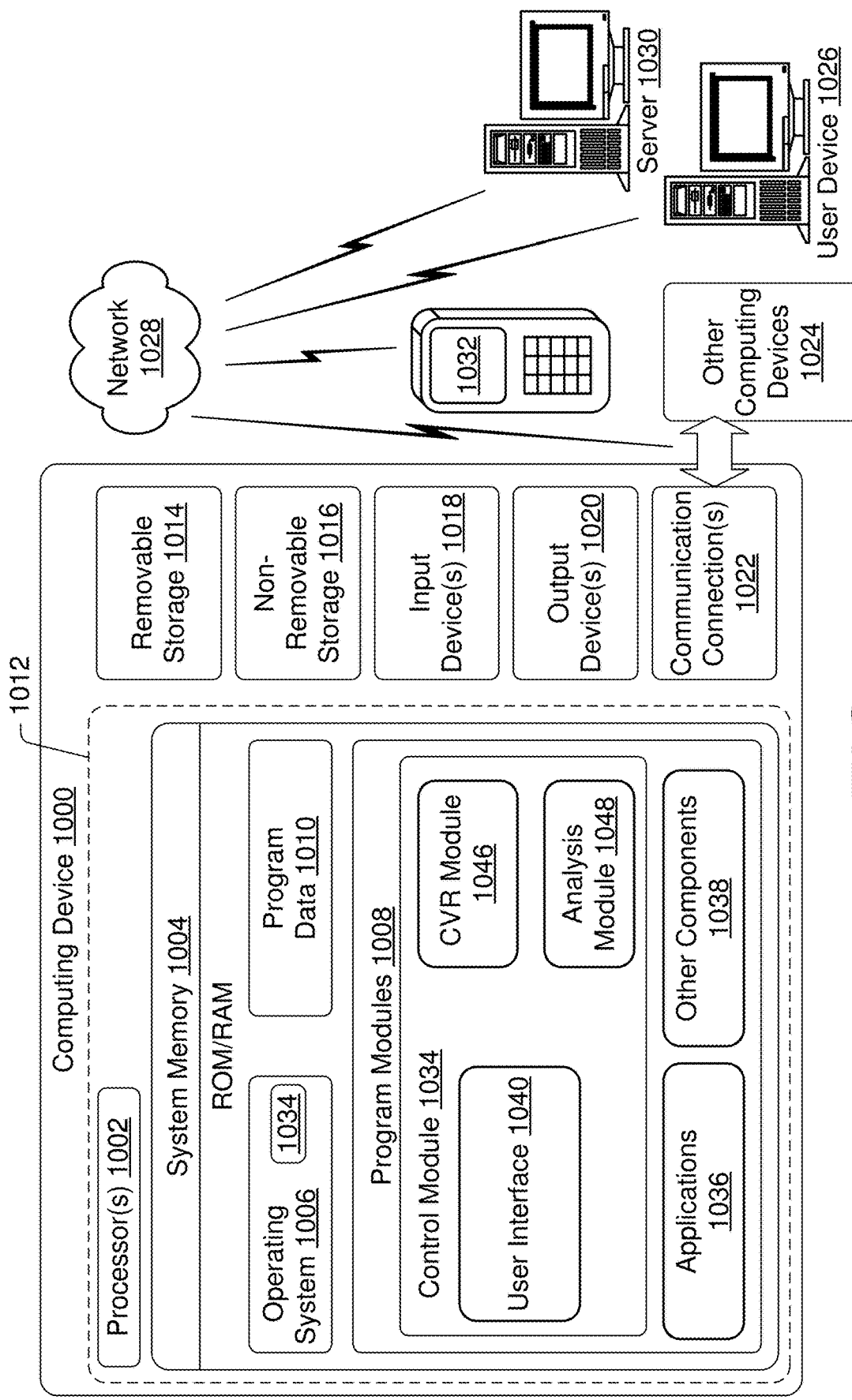
FIG. 10 shows an illustrative embodiment of a computing device.

FIG. 10 illustrates a representative computing device 1000 that may, but need not necessarily be used to, implement the system and methods described herein, in accordance with various embodiments. The techniques and mechanisms described herein may be implemented by multiple instances of the computing device 1000, as well as by any other computing device, system, and/or environment. The computing device 1000 shown in FIG. 10 is only one example of a computing device and is not intended to suggest any limitation as to the scope of use or functionality of any computing device utilized to perform the processes and/or procedures described above.

In at least one configuration, the computing device 1000 includes at least one processor 1002 and system memory 1004. The processor(s) 1002 may execute one or more modules and/or processes to cause the computing device 1000 to perform a variety of functions. In some embodiments, the processor(s) 1002 may include a central processing unit (CPU), a graphics processing unit (GPU), both CPU and GPU, or other processing units or components known in the art. Additionally, each of the processor(s) 1002 may possess its own local memory, which also may store program modules, program data, and/or one or more operating systems.

Depending on the exact configuration and type of the computing device 1000, the system memory 1004 may be volatile (such as RAM), non-volatile (such as ROM, flash memory, miniature hard drive, memory card, or the like) or some combination thereof. The system memory 1004 may include an operating system 1006, one or more program modules 1008, and may include program data 1010. The operating system 1006 includes a component-based framework or control module 1034 that supports components (including properties and events), objects, inheritance, polymorphism, reflection, and provides an object-oriented component-based application programming interface (API). The computing device 1000 is of a very basic illustrative configuration demarcated by a dashed line 1012. Again, a terminal may have fewer components but may interact with a computing device that may have such a basic configuration.

Program modules 1008 may include, but are not limited to, applications 1036, a control module 1034, a user interface 1040, CVR module 1046, analysis module 1048 and/or other components 1038.

The computing device 1000 may have additional features and/or functionality. For example, the computing device 1000 may also include additional data storage devices (removable and/or non-removable) such as, for example, magnetic disks, optical disks, or tape. Such additional storage is illustrated in FIG. 10 by removable storage 1014 and non-removable storage 1016.

The storage devices and any associated computer-readable media may provide storage of computer readable instructions, data structures, program modules, and other data. Computer-readable media includes, at least, two types of computer-readable media, namely computer storage media and communication media.

As used herein, "computer-readable media" includes computer storage media and communication media.

Computer storage media includes volatile and non-volatile, removable and non-removable media implemented in any method or technology for storage of information, such as computer-readable instructions, data structures, program modules, or other data. Computer storage media includes, but is not limited to, random access memory (RAM), read only memory (ROM), electrically erasable programmable ROM (EEPROM), flash memory or other memory technology, compact disk ROM (CD-ROM), digital versatile disks (DVD) or other optical storage, magnetic cassettes, magnetic tape, magnetic disk storage or other magnetic storage devices, or any other medium that can be used to store information for access by a computing device.

In contrast, communication media may embody computer-readable instructions, data structures, program modules, or other data in a modulated data signal, such as a carrier wave. As defined herein, computer storage media does not include communication media.

Moreover, the computer-readable media may include computer-executable instructions that, when executed by the processor(s) 1002, perform various functions and/or operations described herein.

The computing device 1000 may also have input device(s) 1018 such as a keyboard, a mouse, a pen, a voice input device, a touch input device, etc. Output device(s) 1020, such as a display, speakers, a printer, etc. may also be included.

The computing device 1000 may also contain communication connections 1022 that allow the device to communicate with other computing devices 1024, such as over a network. By way of example, and not limitation, communication media and communication connections include wired media such as a wired network or direct-wired connections, and wireless media such as acoustic, radio frequency (RF), infrared, and other wireless media. The communication connections 1022 are some examples of communication media. Communication media may typically be embodied by computer readable instructions, data structures, program modules, etc.

FIG. 10 also shows a schematic diagram of an illustrative operating environment where an illustrative system may operate. For example, various embodiments of the system may operate on the computing device 1000. The computing device 1000 may interact with a user 1026 directly or indirectly. The computing device may be connected to a network 1028. The network device 1028 may provide access to other computing devices 1024 including a server 1030, mobile devices 1032, and/or other connections and/or resources. Connections may be wired or wireless.

The illustrated computing device 1000 is only one example of a suitable device and is not intended to suggest any limitation as to the scope of use or functionality of the various embodiments described. Other well-known computing devices, systems, environments and/or configurations that may be suitable for use with the embodiments include, but are not limited to, personal computers, server computers, hand-held or laptop devices, multiprocessor systems, microprocessor-based systems, set top boxes, game consoles, programmable consumer electronics, network PCs, mini-computers, mainframe computers, distributed computing environments that include any of the above systems or devices, implementations using field programmable gate arrays ("FPGAs") and application specific integrated circuits ("ASICs"), power meters, and/or the like.

The implementation and administration of a shared resource computing environment on a single computing device may enable multiple computer users to concurrently collaborate on the same computing task or share in the same computing experience without reliance on networking hardware such as, but not limited to, network interface cards, hubs, routers, servers, bridges, switches, and other components commonly associated with communications over the Internet, as well without reliance on the software applications and protocols for communication over the Internet.

There is a model that is in use currently to analyze CVR that is referred to as ZIP. The ZIP model requires the use of constant impedance Z, constant current I, and constant power P loads. It models the change in power consumed by a load as a function of the change in voltage with respect to the three constants.

The ZIP model frequently uses a single or series of voltage excursions to establish a CVR Factor ("CVRf") that covers an extended period, such as the present year. The model then takes the CVRf and applies it to a larger, continuous voltage reduction, or the same voltage reduction over a different time interval, for example, the prior year, and assumes the loads were the same to determine the CVR. However, the assumption that the loads during this different interval are the same as during the original interval is often an inaccurate assumption. For example, temperatures vary, solar insolation varies, winds vary, feeder configurations vary, customers come and go, and customer's usages, change, among others.

Additionally, the ZIP method uses the variables Z, I, and P, where solving for one of the three becomes a function of at least the other two variables. When solving for the multiple variables, depending on the balance of variable expression, changes in the output could prevent the method from stabilizing. For example, for small voltage changes, the difference between the impact of Z and I on the resultant power is small. This means a large amount of smoothing is required to stabilize the resulting wild swings in the values of Z and I resulting from the solution. For example, the ZIP method would solve for Z, I, P for hundreds of time periods then use lengthy smoothing to enforce a smooth trajectory for them. This small difference in impact means that, in a noisy environment like a feeder, the method is unable to differentiate between Z and I so there is no stability available in the ZIP analysis.

The ZIP model frequently uses a constrained linear least squares solution for ZIP parameters followed by filtering such as the Svaitzky-Golay filtering to smooth out the results. Error is introduced into the results by the multiple equations used to determine the ZIP parameters and by the Svaitzky-Golay filtering to smooth out the results. In contrast, various embodiments of the SK Analysis provide a streamlined algorithm to relate power changes to voltage changes. It reduces the error associated with filtering in a ZIP analysis to a situationally lesser error associated with the voltage step size change. For example, the SK Analysis does not require the Svaitzky-Golay or equivalent filtering method which smooths out the data points in the ZIP analysis. The ZIP analysis collects multiple measurements and then finds an average through the Svaitzky-Golay filtering method. This smoothing requirement of the ZIP method means that real-time solutions are not possible. As such, the ZIP method isn't practical for various implementations such as transmission frequency balancing or distribution level CVR, or in general at the service meter where memory is at a premium. In contrast, the SK Analysis with sufficiently accurate meters and synchronized measurements is able to approximate real-time results.

Additionally, the ZIP Method involves taking measurements over the course of a period of time, for example 90 minutes of 10 second intervals to determine an individual ZIP value for the high noise environment on a distribution feeder. Alternately it would require large transients to be periodically created.

In contrast, an illustrative embodiment of the SK Analysis over the same time period is able to be performed by averaging the SK parameters for the two-time intervals on either side of the referenced time and does not need to differentiate between a squared response and a linear one with small step differences. Here, the Svaitzky-Golay filtering is not required.

The SK Analysis may be used to detect, by for example, meter voltage and power measurement time skew, synchronizing several meters to determine if a meter is malfunctioning and also obtain a measurement of line losses. The SK Analysis is not limited to distribution network of a power utility but can be used for transmission networks and determining the load characteristics of individual devices as well. Additionally or alternatively, the composition of the line as expressed in terms of S and K may enable the utility to determine when and/or how much to modify power generation to maintain frequency and voltage when load balancing.

Illustrative SK Transmission Analysis

When transmitting power in a transmission setting, a balancing authority has to balance frequency through ACE Error. This balancing may be accomplished by increasing or decreasing generation. The magnitude of a generator AC voltage can be written as a function of the field strength and rotor speed, $$V = cBf \quad (16)$$

Where c is a constant, B is the field strength and f is the frequency associated with the rotor.

For a change in frequency $V_0$ and $V_1$ may be expressed as:

$$V_0 = cBf_0, \quad V_1 = cBf_1 \quad (17, 18)$$

Substituting into equation 1 and cancelling common terms yields:

$$P_1 = P_0[S(f_1/f_0)^2 + K] \quad (19)$$

In this setting, changing the power alters the frequency differently for various SK values. As such, it would imply that generation would alter system frequency differently for various SK values. Consequently, this allows modification of the ACE equation or generation AGC (automatic gain control) based on SK values at that time. For example, the ACE Equation:

$$ACE = (NIA - NIS) - 10B(FA - FS) - IME \quad (20)$$

Where: NIA is Net Interchange, Actual NIS is Net Interchange, Scheduled B is Balancing Authority Bias FA is Frequency, Actual FS is Frequency, Scheduled IME is Interchange (tie line) Metering Error.

One of the various benefits that may be achieved with this technique, is that the SK based method provides for tighter control over the frequency balancing. For example, the SK approach allows for changing the power generation with less over shooting or undershooting the desired frequency than other methods allow for. For example, the power generation for frequency balancing may be determined with a frequency error below a frequency error threshold. For example, the system may, on a regular or real-time basis, determine the power generation required to balance the frequency. One of the various benefits of the SK technique is that the resulting frequency from a power generation setting is closer to the desired frequency resulting in a frequency error below a threshold. This allows the system to determine a power generation setting that will balance the frequency more rapidly and with less over or undershoot of the frequency.

Illustrative Load Disaggregation

Load disaggregation currently is done by characterizing the electrical properties over time of a load. For instance, a specific model of washing machine by a particular manufacturer would have power trajectory through time for each of its cycles (e.g., wash, rinse, spin, etc.). SK parameters could be generated to represent each cycle. As such, instead of a trajectory for each model as before, now there could be common SK values and power levels generated for a type of motor by that vendor, allowing any washing machine that used that motor to inherit a prior defined representation based on the SK values and power levels. This would allow a reduced cost and effort of determining different models' power trajectory since they can be standardized, for example, based on the specific motor. This approach may be applied to any load drawing apparatus used on the system.

Illustrative Embodiments

Various embodiments contemplate various implementations and uses of the technology. For example, a computer-implemented method comprising executing instructions in a computer system to perform the operations of collecting a first set of values from an electric power consumption point, and determining based at least in part on the first set of values that a voltage level is above a threshold value. Additionally, the operations may comprise adjusting the voltage level closer to the threshold value at the consumption point, and collecting a second set of values from the electric power consumption point. For example, the adjusting the voltage level closer to the threshold value at the consumption point comprises adjusting the voltage level based at least in part on a mathematical description of the power vs resistance relationship for that voltage control algorithm.

Additionally, the operations may comprise determining based at least in part on the second set of values that the voltage level is at or within a desired range below the threshold, and determining a Constant Impedance Load value and a Constant Power Load value based on voltage values and power values from the second set of collected data. Additionally, the operations may comprise modeling a power load at the power consumption point with the Constant Impedance Load value and the Constant Power Load value and evaluating the Constant Impedance Load value or the Constant Power Load value for a referenced time comprising, based at least in part on a single voltage change or using a weighted average of one or more of the Constant Impedance Load values or the Constant Power Load values for two or more time intervals on either side of a referenced time, relating power changes to voltage changes. Additionally, the operations may comprise generating a measurement of the voltage and power, and evaluating a Conservation Voltage Reduction, based at least in part on, the Constant Impedance Load value and the Constant Power Load value, comprising relating power value changes to resistance value changes based at least in part on voltage through the Constant Impedance Load value or the Constant Power Load value.

Additionally or alternatively, various embodiments contemplate that the electric power consumption point is located on a distribution network. Additionally or alternatively, a regulator is used to adjust the voltage based on a different operating algorithm or set point.

Additionally or alternatively, various embodiments contemplate that a load tap changer on a transformer is used to adjust the voltage closer to the threshold value at the consumption point. Additionally or alternatively, various embodiments contemplate that a capacitor bank is used to adjust the voltage closer to a different operating point.

An additional embodiment contemplates a method comprising collecting a first set of values from an electric power consumption point, determining based at least in part on the first set of values that a voltage level is above a threshold value, and adjusting the voltage level closer to the threshold value at the consumption point. Additionally, the method may include collecting a second set of values from the electric power consumption point, determining based at least in part on the second set of values that the voltage level is at the threshold, and determining a Constant Impedance Load value and a constant power load value based on voltage values and power values from the second set of collected data. Additionally, the method may include modeling an entire power load with the Constant Impedance Load value and the Constant Power Load value.

Additionally, the method may include averaging one or more of the Constant Impedance Load values or the Constant Power Load values for two-time intervals on either side of a referenced time, relating power changes to voltage changes, generating a real-time measurement of the voltage and power, and evaluating a Conservation Voltage Reduction, based at least in part on, the Constant Impedance Load value and the Constant Power Load value, comprising relating power value changes to resistance value changes based at least in part on voltage through the Constant Impedance Load value or the Constant Power Load value.

Additionally or alternatively, various embodiments contemplate that the electric power consumption point is located on a distribution network. Additionally or alternatively, various embodiments contemplate that a voltage regulator is used to adjust the voltage closer to the threshold value at the consumption point, the adjusting based at least in part on a different operating algorithm or set point. For example, the electric power consumption point is located on a distribution network.

Additionally or alternatively, various embodiments contemplate that a load tap changer on a transformer is used to adjust the voltage closer to the threshold value at the consumption point.

Additionally or alternatively, various embodiments contemplate that a capacitor bank is used to adjust the voltage closer to the threshold value at the consumption point.

An additional embodiment contemplates a system comprising one or more processors, memory, and instructions stored on the memory that, when executed by the one or more processors, configure the one or more processors to perform operations. For example, the operations may comprise collecting a first set of values from an electric power consumption point, determining based at least in part on the first set of values that a voltage level is above a threshold value, adjusting the voltage level closer to the threshold value at the consumption point, and collecting a second set of values from the electric power consumption point.

Additionally or alternatively, various embodiments contemplate that the operations may include determining based at least in part on the second set of values that the voltage level is at or below the threshold, determining a Constant Impedance Load value and a constant power load value based on voltage values and power values from the second set of collected data, and modeling an entire power load with the Constant Impedance Load value and the Constant Power Load value. Additionally or alternatively, various embodiments contemplate that the operations may also include averaging the Constant Impedance Load values and the Constant Power Load values for two-time intervals on either side of a referenced time, relating, based at least in part on the Constant Impedance Load values and the Constant Power Load values, power changes to voltage changes, generating a measurement of the voltage and power, and evaluating a Conservation Voltage Reduction, based at least in part on, the Constant Impedance Load value and the Constant Power Load value, comprising relating power value changes to resistance value changes based at least in part on voltage through the Constant Impedance Load value or the Constant Power Load value.

For example, one or more of a voltage regulator, a load tap changer on a transformer, or a capacitor bank, among others may be used to adjust the voltage closer to the threshold value at the consumption point.

Additionally or alternatively, various embodiments contemplate additional various implementations and uses of the technology. For example, a computer-implemented method comprising executing instructions in a computer system to perform the operations of determining a constant impedance load value and a constant power load value based on voltage values and power values from a collected data of an electric power consumption point, modeling and entire power load with the constant impedance load value and the constant power load value, and averaging the constant impedance load values and the constant power load values for one or more intervals on either side of a referenced time. For example, various embodiments contemplate that the electric power consumption point is located on a distribution network.

Additionally or alternatively, various embodiments contemplate that the operations may also include relating power changes to voltage changes, generating a measurement of the voltage and power, and determining, based at least in part on the constant impedance load value and the constant power load value, one or more of power generation for frequency balancing or energy savings by relating power value changes to resistance value changes as a function of voltage through the constant impedance load value. For example, various embodiments contemplate that the power generation for frequency balancing is determined with a frequency error below a frequency error threshold.

Additionally or alternatively, various embodiments contemplate that a controller adjusts the frequency based at least in part on the frequency error. Additionally or alternatively, various embodiments contemplate that the controller may adjust the frequency by adjusting power generation, injecting stored power, transferring power to another power consumption area, or combinations thereof, among others.

For example, one or more of a voltage regulator, a load tap changer on a transformer, a capacitor bank, or combinations thereof may be used to adjust the frequency closer to a threshold value at the consumption point.

Additionally or alternatively, various embodiments contemplate that the operations may also include determining a second constant impedance load value and a second constant power load value based on voltage values and power values from a second collected data of a second power consumption point, and based at least in part on the constant impedance load value, the constant power load value, the second constant impedance load value, and the second constant power load value, adjusting a load at one or more of the power consumption point or the second power consumption point to one or more of level a voltage drop between the power consumption point and the second power consumption point, or reduce an overall load on system providing power to the power consumption point and the second power consumption point.

Additionally or alternatively, various embodiments contemplate that the operations may also include determining a second constant impedance load value and a second constant power load value based on voltage values and power values from a second collected data of a second power consumption point, and based at least in part on the constant impedance load value, the constant power load value, the second constant impedance load value, and the second constant power load value, adjusting a power source at one or more of the power consumption point or the second power consumption point to one or more of level a voltage drop between the power consumption point and the second power consumption point, or reduce an overall load on system providing power to the power consumption point and the second power consumption point. For example, the power source may comprise one or more of an energy storage device, a fuel cell, a solar panel, a windmill, a hydropower generator, a geothermal energy system, or a biomass energy system.

Additionally or alternatively, various embodiments contemplate a method comprising determining a constant impedance load value and a constant power load value based on voltage values and resistance values from the collected data, modeling an entire power load with the constant impedance load value and the constant power load value, averaging the constant impedance load values and the constant power load values for two-time intervals on either side of a referenced time, and relating, based at least in part on the constant impedance load values and the constant power load values, power changes to voltage changes. For example, the collected data is collected at an electric power consumption point located on a distribution network.

Additionally or alternatively, various embodiments contemplate that the method may also comprise generating a real-time measurement of the voltage and power, and determining, based at least in part on the constant impedance load value and the constant power load value, one or more of losses in power lines or power generation for frequency balancing.

Additionally or alternatively, various embodiments contemplate that a controller adjusts the frequency based at least in part on the frequency error. Additionally or alternatively, various embodiments contemplate that the controller may adjust the frequency by adjusting power generation, injecting stored power, transferring power to another power consumption area, or combinations thereof, among others.

For example, one or more of a voltage regulator, a load tap changer on a transformer, a capacitor bank, or combinations thereof may be used to adjust the frequency closer to a threshold value at the consumption point.

Additionally or alternatively, various embodiments contemplate that the method may also include determining a second constant impedance load value and a second constant power load value based on voltage values and power values from a second collected data of a second power consumption point, and based at least in part on the constant impedance load value, the constant power load value, the second constant impedance load value, and the second constant power load value, adjusting a load at one or more of the power consumption point or the second power consumption point to one or more of level a voltage drop between the power consumption point and the second power consumption point, or reduce an overall load on system providing power to the power consumption point and the second power consumption point.

Additionally or alternatively, various embodiments contemplate that the method may also include determining a second constant impedance load value and a second constant power load value based on voltage values and power values from a second collected data of a second power consumption point, and based at least in part on the constant impedance load value, the constant power load value, the second constant impedance load value, and the second constant power load value, adjusting a power source at one or more of the power consumption point or the second power consumption point to one or more of level a voltage drop between the power consumption point and the second power consumption point, or reduce an overall load on system providing power to the power consumption point and the second power consumption point.

Additionally or alternatively, various embodiments contemplate that the power source may comprise one or more of an energy storage device, a fuel cell, a solar panel, a windmill, a hydropower generator, a geothermal energy system, or a biomass energy system.

Additionally or alternatively, various embodiments contemplate a system comprising one or more processors, memory, and instructions stored on the memory that, when executed by the one or more processors, configure the one or more processors to perform operations. For example, the operation may include determining a constant impedance load value and a constant power load value based on voltage values and power values from the collected data, modeling an entire power load with the constant impedance load value and the constant power load value, averaging constant impedance load values and the constant power load values for two-time intervals on either side of a reference time, and relating, based at least in part on the constant impedance load values and the constant power load values, power changes to voltage changes. For example, the electric power consumption point may be located on a distribution network.

Additionally or alternatively, various embodiments contemplate that the operations may also include generating a real-time measurement of voltage and power, and determining, based at least in part on constant impedance load values and the constant power load values, one or more of power generation for frequency balancing or that the power load should be adjusted at an electric power distribution consumption point.

Additionally or alternatively, various embodiments contemplate that a controller adjusts the frequency based at least in part on the frequency error. Additionally or alternatively, various embodiments contemplate that the controller may adjust the frequency by adjusting power generation, injecting stored power, transferring power to another power consumption area, or combinations thereof, among others.

For example, one or more of a voltage regulator, a load tap changer on a transformer, a capacitor bank, or combinations thereof may be used to adjust the frequency closer to a threshold value at the consumption point.

Additionally or alternatively, various embodiments contemplate that the operation may also include determining a second constant impedance load value and a second constant power load value based on voltage values and power values from a second collected data of a second power consumption point, and based at least in part on the constant impedance load value, the constant power load value, the second constant impedance load value, and the second constant power load value, adjusting a load at one or more of the power consumption point or the second power consumption point to one or more of level a voltage drop between the power consumption point and the second power consumption point, or reduce an overall load on system providing power to the power consumption point and the second power consumption point.

Additionally or alternatively, various embodiments contemplate that the operation may also include determining a second constant impedance load value and a second constant power load value based on voltage values and power values from a second collected data of a second power consumption point, and based at least in part on the constant impedance load value, the constant power load value, the second constant impedance load value, and the second constant power load value, adjusting a power source at one or more of the power consumption point or the second power consumption point to one or more of level a voltage drop between the power consumption point and the second power consumption point, or reduce an overall load on system providing power to the power consumption point and the second power consumption point.

Additionally or alternatively, various embodiments contemplate that the power source may comprise one or more of an energy storage device, a fuel cell, a solar panel, a windmill, a hydropower generator, a geothermal energy system, or a biomass energy system.

CONCLUSION

Although embodiments have been described in language specific to structural features and/or methodological acts, it is to be understood that the disclosure is not necessarily limited to the specific features or acts described. Rather, the specific features and acts are disclosed herein as illustrative forms of implementing the embodiments. Any portion of one embodiment may be used in combination with any portion of a second embodiment.

What is claimed is:

1. A computer-implemented method comprising executing instructions in a computer system to perform operations of:
   determining a constant impedance load value and a constant power load value based on voltage values and power values from a collected data of an electric power consumption point;
   modeling an entire power load with the constant impedance load value and the constant power load value;
   averaging the constant impedance load values and the constant power load values for one or more intervals on either side of a referenced time;
   relating power changes to voltage changes;
   generating a measurement of voltage and power; and
   determining, based at least in part on the constant impedance load value and the constant power load value, one or more of power generation for frequency balancing or energy savings by relating power value changes to resistance value changes as a function of voltage through the constant impedance load value.

2. The computer-implemented method of claim 1, wherein the one or more of power generation for frequency balancing is determined with a frequency error below a frequency error threshold.

3. The computer-implemented method of claim 1, wherein the electric power consumption point is located on a distribution network.

4. The computer-implemented method of claim 1, wherein a controller is used to control a voltage regulator to adjust the frequency closer to a threshold value at the electric power consumption point.

5. The computer-implemented method of claim 1, wherein a controller is used to control a load tap changer on a transformer to adjust the frequency closer to a threshold value at the electric power consumption point.

6. The computer-implemented method of claim 1, wherein a controller is used to control a capacitor bank to adjust the frequency closer to a threshold value at the electric power consumption point.

7. The computer-implemented method of claim 1, further comprising:
   determining a second constant impedance load value and a second constant power load value based on voltage values and power values from a second collected data of a second power consumption point; and
   based at least in part on the constant impedance load value, the constant power load value, the second constant impedance load value, and the second constant power load value, adjusting a load at one or more of the electric power consumption point or the second power consumption point to one or more of level a voltage drop between the electric power consumption point and the second power consumption point, or reduce an overall load on system providing power to the electric power consumption point and the second power consumption point.

8. The computer-implemented method of claim 1, further comprising:
   determining a second constant impedance load value and a second constant power load value based on voltage values and power values from a second collected data of a second power consumption point; and
   based at least in part on the constant impedance load value, the constant power load value, the second constant impedance load value, and the second constant power load value, adjusting a power source at one or more of the electric power consumption point or the second power consumption point to one or more of level a voltage drop between the electric power consumption point and the second power consumption point, or reduce an overall load on system providing power to the electric power consumption point and the second power consumption point.

9. The computer-implemented method of claim 8, wherein the power source comprises one or more of an energy storage device, a fuel cell, a solar panel, a windmill, a hydropower generator, a geothermal energy system, or a biomass energy system.

10. A method comprising:
    determining a constant impedance load value and a constant power load value based on voltage values and resistance values from collected data;
    modeling an entire power load with the constant impedance load value and the constant power load value;
    averaging the constant impedance load values and the constant power load values for two-time intervals on either side of a referenced time;

relating, based at least in part on the constant impedance load values and the constant power load values, power changes to voltage changes;
generating a real-time measurement of voltage and power; and
determining, based at least in part on the constant impedance load value and the constant power load value, one or more of losses in power lines or power generation for frequency balancing.

11. The method of claim 10, wherein the collected data is collected at an electric power consumption point located on a distribution network.

12. The method of claim 10, wherein a controller is used to control a voltage regulator to adjust the frequency closer to a threshold value at a consumption point.

13. The method of claim 10, wherein a controller is used to control a load tap changer on a transformer to adjust the frequency closer to a threshold value at a consumption point.

14. The method of claim 10, wherein a controller is used to control a capacitor bank is used to adjust the frequency closer to a threshold value at a consumption point.

15. The method of claim 10, further comprising:
determining a second constant impedance load value and a second constant power load value based on voltage values and power values from a second collected data of a second power consumption point; and
based at least in part on the constant impedance load value, the constant power load value, the second constant impedance load value, and the second constant power load value, adjusting a load at one or more of the power consumption point or the second power consumption point to one or more of level a voltage drop between the power consumption point and the second power consumption point, or reduce an overall load on system providing power to the power consumption point and the second power consumption point.

16. The method of claim 10, further comprising:
determining a second constant impedance load value and a second constant power load value based on voltage values and power values from a second collected data of a second power consumption point; and
based at least in part on the constant impedance load value, the constant power load value, the second constant impedance load value, and the second constant power load value, adjusting a power source at one or more of the power consumption point or the second power consumption point to one or more of level a voltage drop between the power consumption point and the second power consumption point, or reduce an overall load on system providing power to the power consumption point and the second power consumption point.

17. The method of claim 16, wherein the power source comprises one or more of an energy storage device, a fuel cell, a solar panel, a windmill, a hydropower generator, a geothermal energy system, or a biomass energy system.

18. A system comprising:
one or more processors;
memory; and
instructions stored on the memory that, when executed by the one or more processors, configure the one or more processors to perform operations comprising:
determining a constant impedance load value and a constant power load value based on voltage values and power values from collected data;
modeling an entire power load with the constant impedance load value and the constant power load value;
averaging constant impedance load values and the constant power load values for two-time intervals on either side of a reference time;
relating, based at least in part on the constant impedance load values and the constant power load values, power changes to voltage changes;
generating a real-time measurement of voltage and power; and
determining, based at least in part on constant impedance load values and the constant power load values, one or more of power generation for frequency balancing or that the power load should be adjusted at an electric power distribution consumption point.

19. The system of claim 18, wherein the electric power distribution consumption point is located on a distribution network.

20. The system of claim 18, wherein a voltage regulator is used to adjust the frequency closer to a threshold value at the electric power distribution consumption point.

21. The system of claim 18, wherein a load tap changer on a transformer is used to adjust the frequency closer to a threshold value at the electric power distribution consumption point.

22. The system of claim 18, wherein a capacitor bank is used to adjust the frequency closer to a threshold value at the electric power distribution consumption point.

23. The system of claim 18, further comprising:
determining a second constant impedance load value and a second constant power load value based on voltage values and power values from a second collected data of a second power consumption point; and
based at least in part on the constant impedance load value, the constant power load value, the second constant impedance load value, and the second constant power load value, adjusting a load at one or more of the electric power distribution consumption point or the second power consumption point to one or more of level a voltage drop between the electric power distribution consumption point and the second power consumption point, or reduce an overall load on system providing power to the electric power distribution consumption point and the second power consumption point.

24. The system of claim 18, further comprising:
determining a second constant impedance load value and a second constant power load value based on voltage values and power values from a second collected data of a second power consumption point; and
based at least in part on the constant impedance load value, the constant power load value, the second constant impedance load value, and the second constant power load value, adjusting a power source at one or more of the electric power distribution consumption point or the second power consumption point to one or more of level a voltage drop between the electric power distribution consumption point and the second power consumption point, or reduce an overall load on system providing power to the electric power distribution consumption point and the second power consumption point.

25. The system of claim 24, wherein the power source comprises one or more of an energy storage device, a fuel cell, a solar panel, a windmill, a hydropower generator, a geothermal energy system, or a biomass energy system.

* * * * *